(12) United States Patent
Dry et al.

(10) Patent No.: US 10,008,473 B2
(45) Date of Patent: Jun. 26, 2018

(54) POWER PACKAGE LID

(71) Applicant: TriQuint Semiconductor, Inc., Hillsboro, OR (US)

(72) Inventors: Robert Charles Dry, Oak Ridge, NC (US); Steve Jones, Greensboro, NC (US); Jonathan Fain, Sachse, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days. days.

(21) Appl. No.: 15/140,928

(22) Filed: Apr. 28, 2016

(65) Prior Publication Data
US 2016/0240511 A1 Aug. 18, 2016

Related U.S. Application Data

(63) Continuation-in-part of application No. 14/728,280, filed on Jun. 2, 2015, now Pat. No. 9,666,498.

(Continued)

(51) Int. Cl.
*H05K 1/11* (2006.01)
*H01L 25/065* (2006.01)
(Continued)

(52) U.S. Cl.
CPC ........ *H01L 25/0655* (2013.01); *H01L 23/047* (2013.01); *H01L 23/13* (2013.01); *H01L 23/36* (2013.01); *H01L 23/5383* (2013.01); *H01L 24/32* (2013.01); *H01L 24/49* (2013.01); *H01L 24/73* (2013.01); *H01L 23/10* (2013.01); *H01L 24/48* (2013.01); *H01L 2224/32225* (2013.01); *H01L 2224/32245* (2013.01); *H01L 2224/48091* (2013.01); *H01L 2224/48137* (2013.01);
(Continued)

(58) Field of Classification Search
CPC ... H01L 25/0655; H01L 23/047; H01L 23/13; H01L 23/36; H01L 23/5383; H01L 24/32
USPC ................. 174/266, 250, 251, 255–261, 267
See application file for complete search history.

(56) References Cited

U.S. PATENT DOCUMENTS 3,040,119 A 6/1962 Granzow
5,261,157 A * 11/1993 Chang ..................... H01L 21/50
156/285

(Continued)

OTHER PUBLICATIONS

Aboush, Z. et al., "Novel Cost-efficient Packaging Technology for High-Power LDMOS Devices," Tenth High Frequency Postgraduate Student Colloquium, IEEE, Sep. 5-6, 2005, 4 pages.

(Continued)

*Primary Examiner* — Tremesha S Willis
(74) *Attorney, Agent, or Firm* — Withrow & Terranova, P.L.L.C.

(57) ABSTRACT

The present disclosure relates to a ring-frame power package. In this regard, the ring-frame power package includes a thermal carrier and a ring structure. The thermal carrier has a carrier surface. The ring structure includes a ring body that is disposed over the carrier surface of the thermal carrier so that a portion of the carrier surface is exposed through an interior opening of the ring body. The ring-frame power package also includes a power package lid that is disposed over the ring body. The power package lid includes a cavity in communication with the interior opening of the ring body. In this manner, the power package lid covers and protects semiconductor devices and corresponding wires encased by the ring-frame power package.

17 Claims, 10 Drawing Sheets

Related U.S. Application Data

(60) Provisional application No. 62/192,602, filed on Jul. 15, 2015, provisional application No. 62/006,547, filed on Jun. 2, 2014.

(51) Int. Cl.

| | | |
|---|---|---|
| *H01L 23/00* | (2006.01) | |
| *H01L 23/047* | (2006.01) | |
| *H01L 23/13* | (2006.01) | |
| *H01L 23/36* | (2006.01) | |
| *H01L 23/538* | (2006.01) | |
| *H01L 23/10* | (2006.01) | |

(52) U.S. Cl.
CPC .............. *H01L 2224/48177* (2013.01); *H01L 2224/49175* (2013.01); *H01L 2224/73265* (2013.01); *H01L 2924/00014* (2013.01); *H01L 2924/01047* (2013.01); *H01L 2924/01079* (2013.01); *H01L 2924/15153* (2013.01); *H01L 2924/15724* (2013.01); *H01L 2924/15738* (2013.01); *H01L 2924/15747* (2013.01)

(56) References Cited

U.S. PATENT DOCUMENTS

| | | | |
|---|---|---|---|
| 5,650,915 A * | 7/1997 | Alfaro | ................. H01L 21/50 257/710 |
| 5,864,092 A | 1/1999 | Gore et al. | |
| 7,446,411 B2 | 11/2008 | Condie et al. | |
| 8,362,606 B2 | 1/2013 | Ho et al. | |
| 2009/0194880 A1 | 8/2009 | Feng et al. | |
| 2010/0176468 A1 | 7/2010 | Ishii | |
| 2011/0201159 A1 | 8/2011 | Mori et al. | |
| 2015/0024576 A1 | 1/2015 | Shinoda et al. | |
| 2015/0348897 A1 | 12/2015 | Dry | |

OTHER PUBLICATIONS

Author Unknown, "Castellation," mbedded.ninja, Date Unknown, 5 pages, http://www.mbedded.ninja/pcb-design/castellation.

Author Unknown, "edge connecting pad allegro," Forums, PCB Design, Cadence Design Systems, Inc., 2009, 3 pages, http://community.cadence.com/cadence_technology_forums/f/27/t/13352.

Author Unknown, "EPO-TEK® H70E-4 Technical Data Sheet," Epoxy Technology, Inc., Rev. IV, Sep. 2005, 1 page, http://www.epotek.com/site/administrator/components/com_products/assets/files/Style_Uploads/H70E-4.pdf.

Author Unknown, "MMIC Packaging," Data Brochure, Teledyne Labtech Limited, Dec. 2010, 6 pages.

Author Unknown, "MMIC Packaging," Teledyne Labtech Limited, 2010, 1 page, http://www.teledynelabtech.com/mmic_packaging.aspx.

Bessemoulin, A. et al., "A 1-Watt Ku-band Power Amplifier MMIC using Cost-effective Organic SMD Package," 34th European Microwave Conference, IEEE, vol. 1, Oct. 14, 2004, Amsterdam, The Netherlands, pp. 349-352.

Van Heijningen, M. et al., "Novel Organic SMD Package for High-Power Millimeter Wave MMICs," 34th European Microwave Conference, IEEE, vol. 1, Oct. 14, 2004, Amsterdam, The Netherlands, pp. 357-360.

Non-Final Office Action for U.S. Appl. No. 14/728,280, dated Mar. 29, 2016, 15 pages.

Final Office Action for U.S. Appl. No. 14/728,280, dated Jul. 20, 2016, 17 pages.

Advisory Action for U.S. Appl. No. 14/728,280, dated Oct. 5, 2016, 2 pages.

Notice of Allowance and Examiner-Initiated Interview Summary for U.S. Appl. No. 14/728,280, dated Jan. 20, 2017, 15 pages.

* cited by examiner

POWER PACKAGE LID

RELATED APPLICATION

This application claims the benefit of U.S. Provisional Patent Application Ser. No. 62/192,602, filed Jul. 15, 2015, the disclosure of which is incorporated herein by reference in its entirety.

The present application claims priority to and is a continuation-in-part of U.S. patent application Ser. No. 14/728,280 filed Jun. 2, 2015, now U.S. Pat. No. 9,666,498, entitled "RING-FRAME POWER PACKAGE," which claims priority to U.S. Provisional Patent Application Ser. No. 62/006,547, filed Jun. 2, 2014, the disclosures of which are incorporated herein by reference in their entireties.

FIELD OF THE DISCLOSURE

The present disclosure relates to packages for semiconductor devices, and specifically to lower cost packages for semiconductor devices.

BACKGROUND

As semiconductor devices become more pervasive in consumer and commercial grade products, packages employed to encase these semiconductor devices become more important. Traditional packages commonly include a mixture of ceramic and metal technologies that are assembled together using high-temperature brazing processes. Notably, a package may be designed to meet the requirements of the corresponding semiconductor devices that the package encases. Thus, packages may be adapted to support particular power and frequency thresholds.

However, packages adapted to support higher power and higher frequency devices, such as those used in commercial and military applications, incur higher design and fabrication costs. Further, demand for packages designed to support such higher power and higher frequency semiconductor devices continues to grow. Therefore, it would be advantageous to employ a packaging solution for semiconductor devices that is capable of supporting higher power and higher frequency semiconductor devices at a reduced cost.

SUMMARY

The present disclosure relates to a ring-frame power package. In this regard, the ring-frame power package includes a thermal carrier and a ring structure. The thermal carrier has a carrier surface. The ring structure includes a ring body that is disposed over the carrier surface of the thermal carrier so that a portion of the carrier surface is exposed through an interior opening of the ring body. The ring-frame power package also includes a power package lid that is disposed over the ring body. The power package lid includes a cavity in communication with the interior opening of the ring body. In this manner, the power package lid covers and protects semiconductor devices and corresponding wires encased by the ring-frame power package.

According to one embodiment, a ring-frame power package is disclosed. The ring-frame power package comprises a thermal carrier having a carrier surface. The ring-frame power package further comprises a ring structure. The ring structure resides on the carrier surface of the thermal carrier. The ring structure comprises a ring body, wherein a portion of the carrier surface of the thermal carrier is exposed through an interior opening of the ring body. The ring-frame power package further comprises a power package lid. The power package lid resides on the ring body and has a cavity in communication with the interior opening of the ring body.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1A:
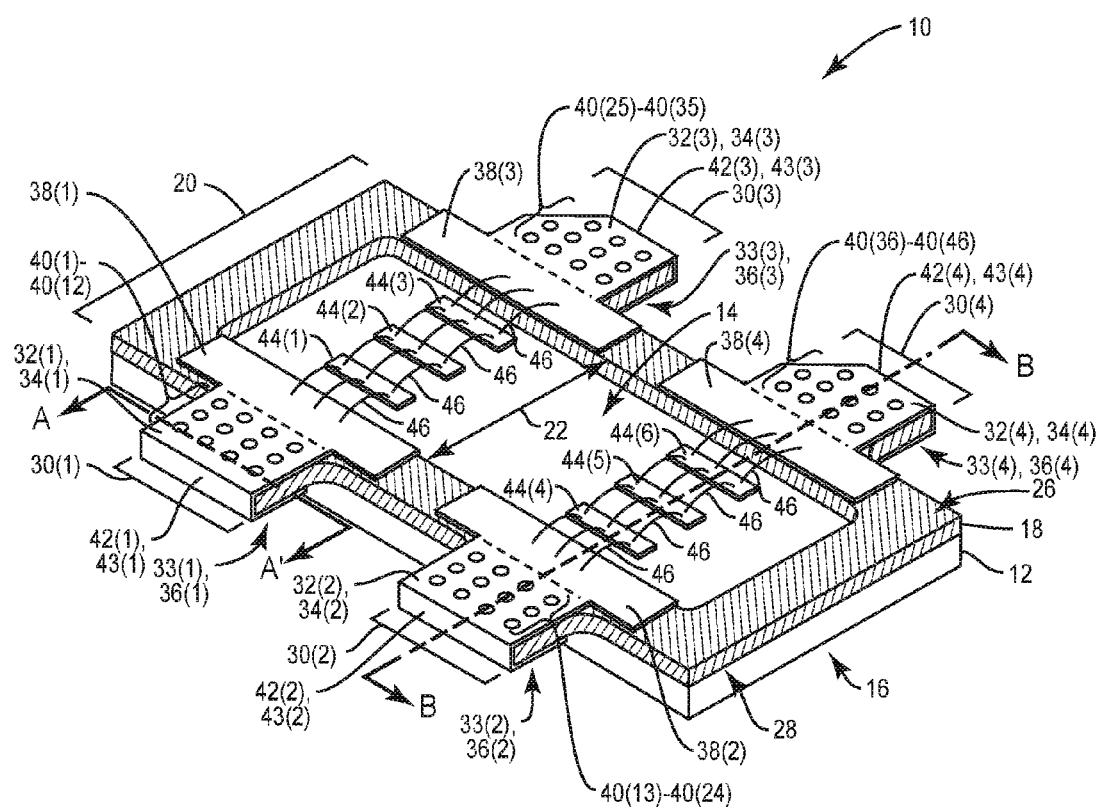
FIG. 1A is a top perspective diagram of an exemplary ring-frame power package with wrap plating.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above," or "upper" or "lower," or "horizontal" or "vertical" may be used herein to describe a relationship of one element, layer, or region to another element, layer, or region as illustrated in the figures.

It will be understood that these terms and those discussed above are intended to encompass different orientations of the device in addition to the orientation depicted in the figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a ring-frame power package. In this regard, the ring-frame power package includes a thermal carrier and a ring structure. The thermal carrier has a carrier surface. The ring structure includes a ring body that is disposed over the carrier surface of the thermal carrier so that a portion of the carrier surface is exposed through an interior opening of the ring body. The ring-frame power package also includes a power package lid that is disposed over the ring body. The power package lid includes a cavity in communication with the interior opening of the ring body. In this manner, the power package lid covers and protects semiconductor devices and corresponding wires encased by the ring-frame power package.

Figure 1B:
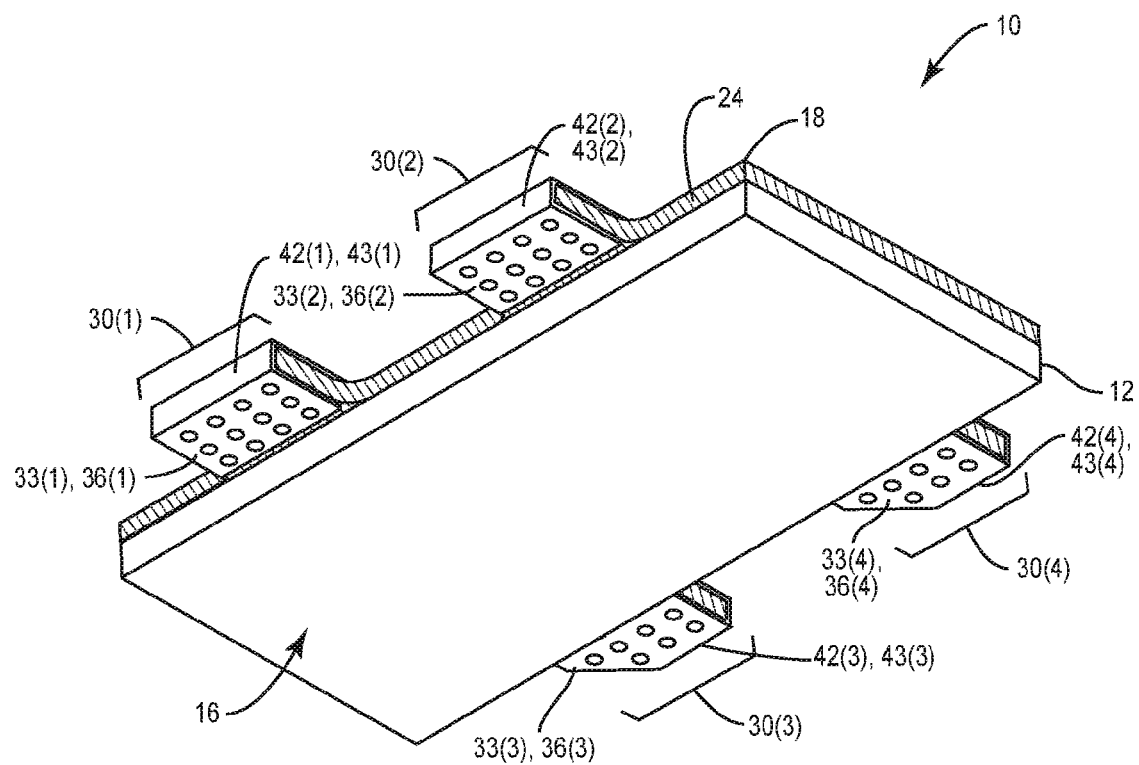
FIG. 1B is a bottom perspective diagram of the exemplary ring-frame power package with wrap plating in FIG. 1A.
Figure 2:
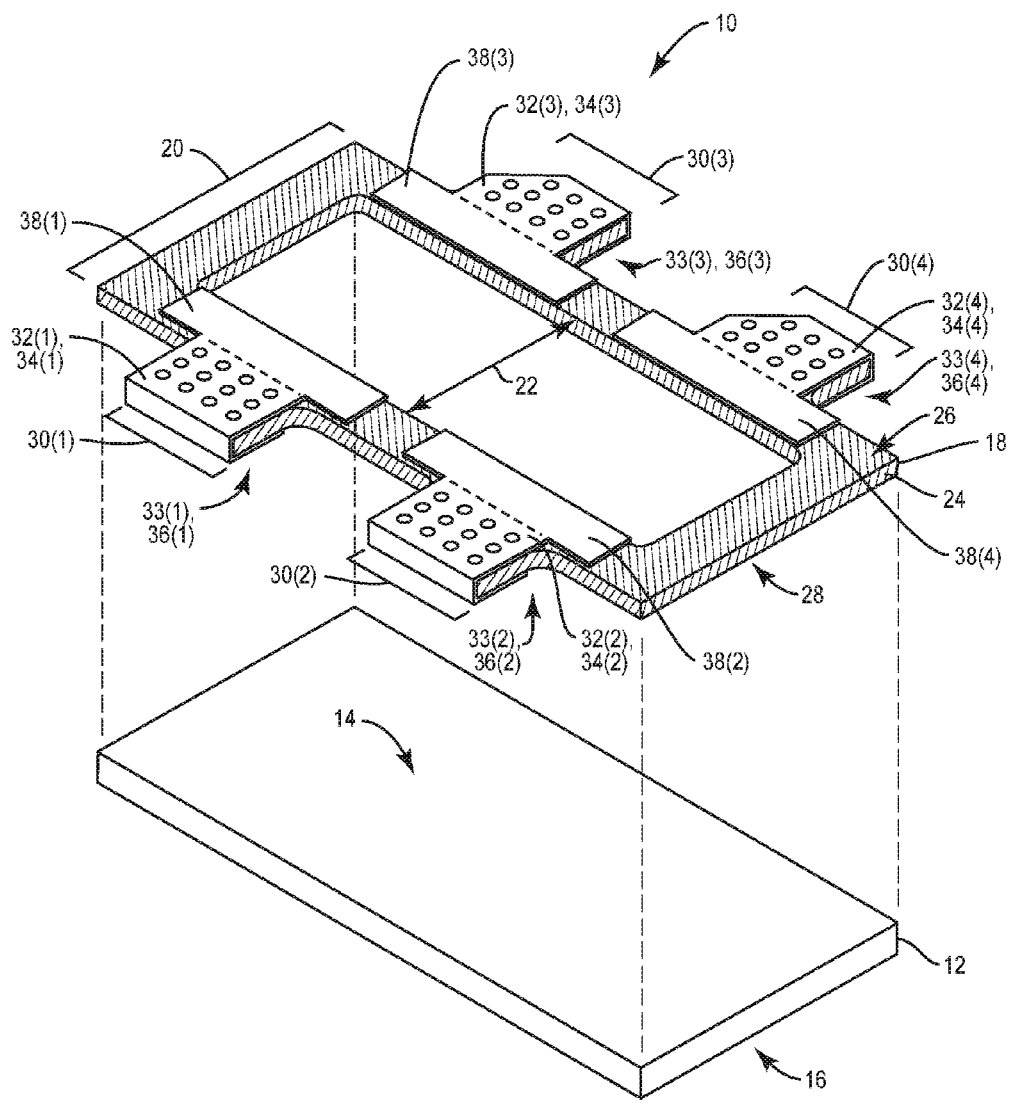
FIG. 2 is a diagram illustrating multiple layers of the ring-frame power package with wrap plating in FIG. 1A.

In this manner, FIGS. 1A, 1B, and 2 illustrate an exemplary ring-frame power package 10 with wrap plating. FIGS. 1A and 1B provide top and bottom perspective diagrams, respectively, of the ring-frame power package 10, while FIG. 2 provides a diagram illustrating multiple layers of the ring-frame power package 10. Notably, components of the ring-frame power package 10 are referred to with common element numbers in FIGS. 1A, 1B, and 2.

With reference to FIGS. 1A, 1B, and 2, the ring-frame power package 10 includes a thermal carrier 12 having a carrier surface 14 and a bottom surface 16. The ring-frame power package 10 also includes a ring structure 18. In this embodiment, the ring structure 18 is formed from an organic laminate material. As non-limiting examples, the organic laminate material of the ring structure 18 may be Isola 370HR FR4, Isola I-Terra FR4, Isola G200 GT resin based material, or Rogers 4000 series materials (e.g., hydrocarbon/ceramic laminates). Notably, the ring structure 18 in alternative embodiments may be a solid structure rather than a laminate structure. The ring structure 18 includes a ring body 20 having an interior opening 22, an outer periphery 24, a top surface 26, and a bottom surface 28. The ring body 20 is disposed over the carrier surface 14 of the thermal carrier 12 so that a portion of the carrier surface 14 is exposed through the interior opening 22. The ring structure 18 also includes interconnect tabs 30(1)-30(4) that extend outward from the outer periphery 24 of the ring body 20. Importantly, wrap plating is employed around each of the interconnect tabs 30(1)-30(4).

In this manner, each interconnect tab 30(1)-30(4) includes a top plated area 32(1)-32(4) that covers at least a portion of a top surface 34(1)-34(4). Each interconnect tab 30(1)-30(4) also includes a bottom plated area 33(1)-33(4) that covers at least a bottom surface 36(1)-36(4) of the corresponding interconnect tab 30(1)-30(4). Notably, the top plated area 32(1)-32(4) also covers a contact portion 38(1)-38(4) of the ring body 20 that is adjacent to each corresponding interconnect tab 30(1)-30(4). In this embodiment, the top and bottom plated areas 32(1)-32(4), 33(1)-33(4) are formed concurrently on the corresponding interconnect tab 30(1)-30(4) from a first conductive material. As described in more detail below, the top plated area 32(1)-32(4) is electrically coupled to the bottom plated area 33(1)-33(4). With particular reference to FIG. 1B, the interconnect tabs 30(1)-30(4) extend from the outer periphery 24 of the ring structure 18 in a manner so that the thermal carrier 12 does not couple to the interconnect tabs 30(1)-30(4). Employing the interconnect tabs 30(1)-30(4) in this manner allows the surface area of the top plated area 32(1)-32(4) and the bottom plated area 33(1)-33(4) of each interconnect tab 30(1)-30(4) to function as a continuous unbroken conductor, thus achieving a performance similar to interconnect tabs formed from a solid first conductive material configured to support high power and high frequency signals. However, the organic laminate material used to create the interconnect tabs 30(1)-30(4) may be less expensive than a similar amount of the first conductive material. Thus, the ring-frame power package 10 may be employed to package high power, high frequency semiconductor devices at a reduced cost.

Additionally, as previously referenced, each top plated area 32(1)-32(4) is electrically coupled to each corresponding bottom plated area 33(1)-33(4), wherein such coupling may be achieved in various ways. In this embodiment, one way in which each top plated area 32(1)-32(4) is electrically coupled to each corresponding bottom plated area 33(1)-33(4) is by way of vias 40(1)-40(46). In this manner, the interconnect tab 30(1) employs the vias 40(1)-40(12), the interconnect tab 30(2) employs the vias 40(13)-40(24), the interconnect tab 30(3) employs the vias 40(25)-40(35), and the interconnect tab 30(4) employs the vias 40(36)-40(46). Notably, the vias 40(1)-40(46) may be formed by drilling corresponding holes in the organic laminate material prior to plating the top and bottom surfaces 34(1)-34(4), 36(1)-36(4) with the first conductive material. Further, before plating the top and bottom surfaces 34(1)-34(4), 36(1)-36(4), the outer perimeter of each hole may be plated with a conductive material, such as a second conductive material wherein the second conductive material corresponding to the vias 40(1)-40(46) (also referred to as the "plated vias 40(1)-40(46)") is adapted to electrically couple the top plated area 32(1)-32(4) to the bottom plated area 33(1)-33(4). As described in more detail below, the vias 40(1)-40(46) in this embodiment are also filled with the first conductive material to achieve greater conductivity. Electrically coupling each top plated area 32(1)-32(4) to the corresponding bottom plated areas 33(1)-33(4) using the vias 40(1)-40(46) allows the interconnect tabs 30(1)-30(4) to function as continuous unbroken conductors. Thus, the interconnect tabs 30(1)-30(4) may achieve a performance similar to interconnect tabs made of a solid first conductive material configured to support high power and high frequency signals.

Further, another way in which each top plated area 32(1)-32(4) is electrically coupled to the corresponding bottom plated area 33(1)-33(4) is by continuing the wrap plating onto a first side surface 42(1)-42(4) of each interconnect tab 30(1)-30(4). In this manner, a first side plated area 43(1)-43(4) of each interconnect tab 30(1)-30(4) covers at least a portion of the corresponding first side surface 42(1)-42(4) with the first conductive material. Continuing the wrap plating onto the first side surfaces 42(1)-42(4) in this manner electrically couples the top and bottom plated areas 32(1)-32(4), 33(1)-33(4). Electrically coupling the top and bottom plated areas 32(1)-32(4), 33(1)-33(4) by way of wrap plating along the first side surfaces 42(1)-42(4) allows the interconnect tabs 30(1)-30(4) to function as a continuous unbroken conductor. Thus, the interconnect tabs 30(1)-30(4) may achieve a performance similar to interconnect tabs made of a solid first conductive material configured to support high power and high frequency signals. Notably, alternative embodiments of the ring-frame power package 10 may electrically couple each top plated area 32(1)-32(4) to the corresponding bottom plated area 33(1)-33(4) by continuing the wrap plating onto the side surfaces of each interconnect tab 30(1)-30(4), such as the first side surfaces 42(1)-42(4), while not employing the vias 40(1)-40(46).

With particular reference to FIG. 1A, the ring-frame power package 10 in this embodiment is adapted to encase semiconductor devices 44(1)-44(6). As a non-limiting example, the semiconductor device 44(2) may be a printed circuit board (PCB) configured to perform certain functions, while the semiconductor devices 44(1), 44(3) may be capacitors configured to transfer voltage to and from the semiconductor device 44(2). The semiconductor device 44(2) is coupled to the semiconductor devices 44(1), 44(3) with bonding wires 46. Additional bonding wires 46 couple the semiconductor devices 44(1), 44(3) to the contact portions 38(1), 38(3) adjacent to the interconnect tabs 30(1), 30(3), respectively. Thus, the interconnect tab 30(1) may be adapted to function as an input port for the semiconductor device 44(1) while the interconnect tab 30(3) may be adapted to function as an output port for the semiconductor device 44(3), or vice versa. The semiconductor devices 44(4)-44(6) and the bonding wires 46 may be similarly configured in relation to the interconnect tabs 30(2), 30(4). Further, to dissipate heat generated by the semiconductor devices 44(1)-44(6), the thermal carrier 12 may be adapted to function as a heat sink. The thermal carrier 12 may also be adapted to function as a ground plane for the ring-frame power package 10. In this manner, the thermal carrier 12 may be formed using materials such as, but not limited to, copper, copper molybdenum, or copper tungsten.

Figure 3:
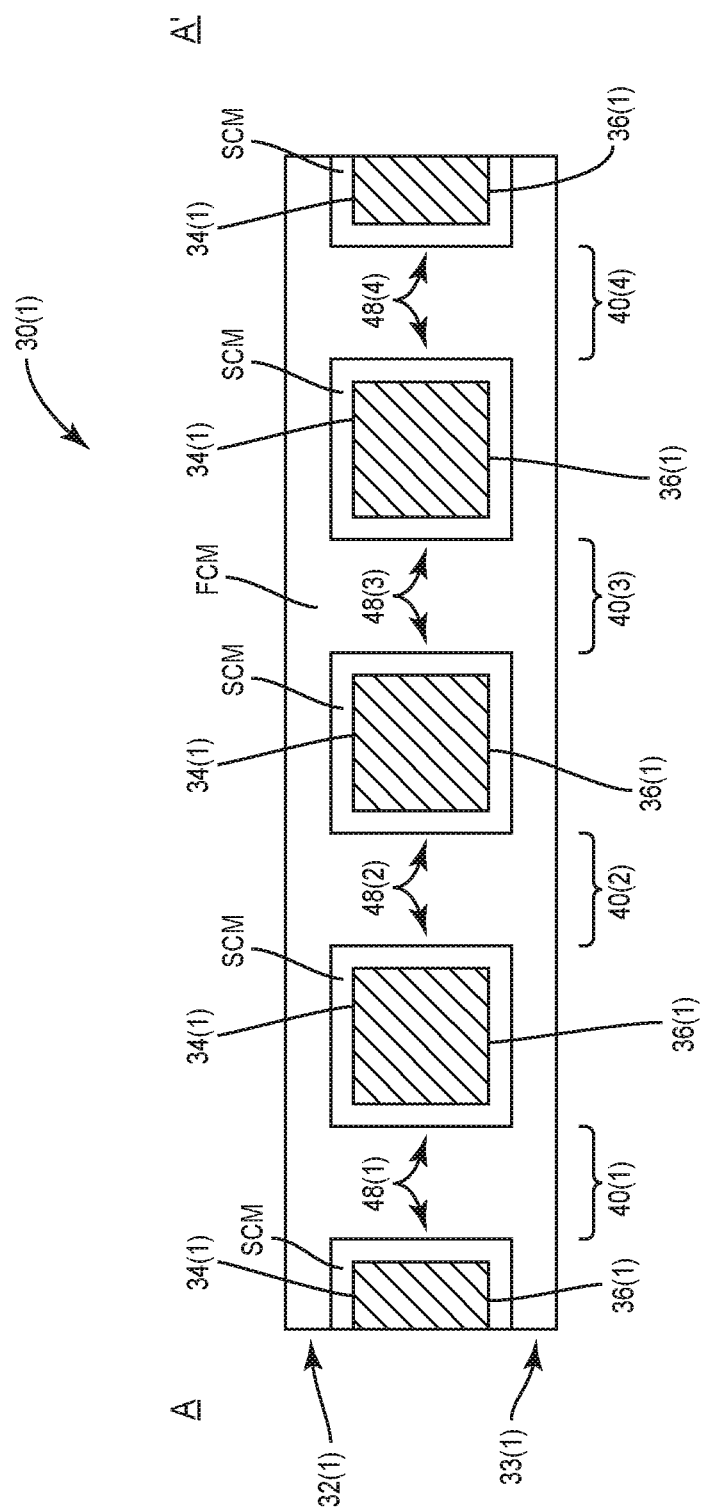
FIG. 3 is a cross-sectional diagram of an interconnect tab of the ring-frame power package with wrap plating in FIG. 1A.

To better illustrate the plating and filling of the vias 40(1)-40(46), FIG. 3 provides a cross-sectional diagram of the interconnect tab 30(1) of the ring-frame power package 10. Notably, while FIG. 3 illustrates the vias 40(1)-40(4), the vias 40(5)-40(46) of the interconnect tabs 30(1)-30(4) are similarly configured. In this manner, after drilling the holes to form the vias 40(1)-40(4), a second conductive material (labeled as "SCM" in FIG. 3) is disposed around an outer perimeter 48(1)-48(4) corresponding to each via 40(1)-40(4). Additionally, the second conductive material is also disposed on the top and bottom surfaces 34(1), 36(1) of the interconnect tab 30(1). Further, the first conductive material (labeled as "FCM" in FIG. 3) is disposed on the top and bottom surfaces 34(1), 36(1) of the interconnect tab 30(1), wherein the first conductive material forms the top plated area 32(1) and the bottom plated area 33(1).

Additionally, in this embodiment, the first conductive material is disposed so as to fill an interior opening of each via 40(1)-40(4). Filling the interior openings of the vias 40(1)-40(4) may provide the interconnect tab 30(1) with greater conductivity, thus helping the interconnect tab 30(1) to achieve conductivity similar to interconnect tabs made substantially of the first conductive material. However, other embodiments may not fill the vias 40(1)-40(4) with the first conductive material, and instead electrically couple the top and bottom plated areas 32(1), 33(1) by way of the second conductive material disposed around the outer perimeter 48(1)-48(4) of each via 40(1)-40(4). Such embodiments may achieve conductivity similar to interconnect tabs made substantially of the first conductive material, although the associated conductivity may be less than embodiments employing filled vias 40(1)-40(4).

Notably, the first and second conductive materials may be made of any combination of conductive materials, such as, but not limited to, gold, silver, copper, and/or aluminum. As a non-limiting example, the first conductive material may be made of gold while the second conductive material may be made of copper. In this manner, the combination of the first and second conductive materials may be selected so as to achieve a desired conductivity level, or so as to control the cost of fabricating the ring-frame power package 10.

Figure 4:
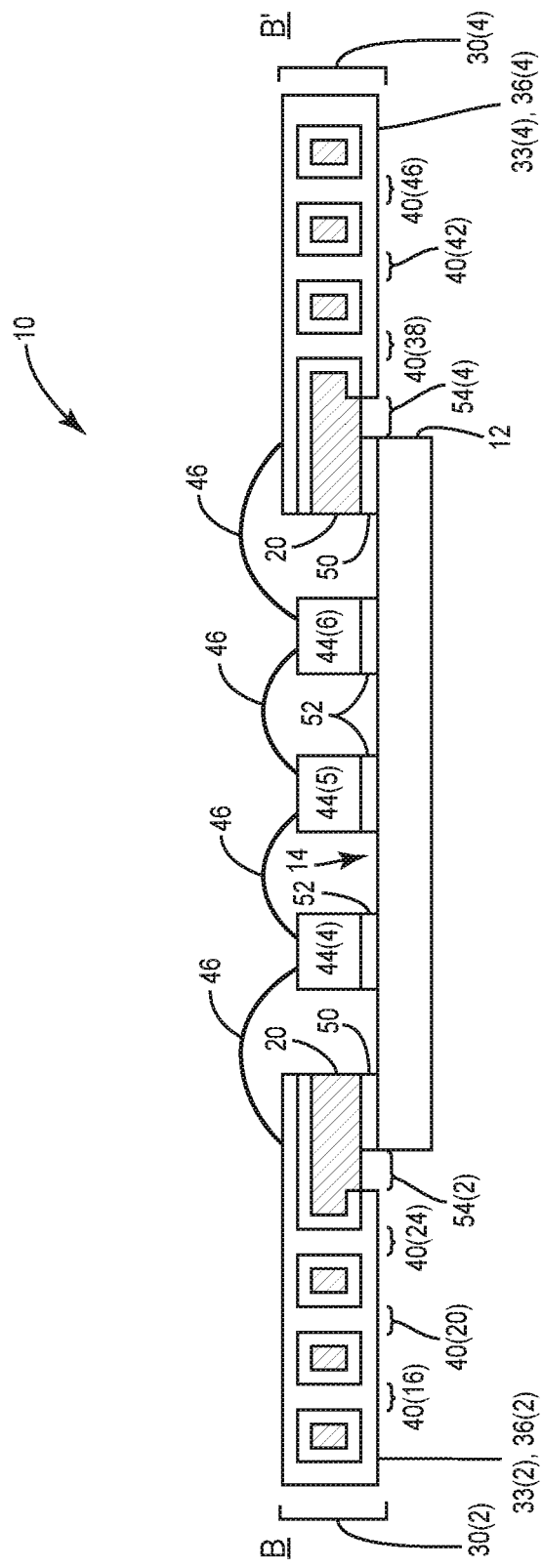
FIG. 4 is a cross-sectional diagram of the ring-frame power package with wrap plating in FIG. 1A.
Figure 5:
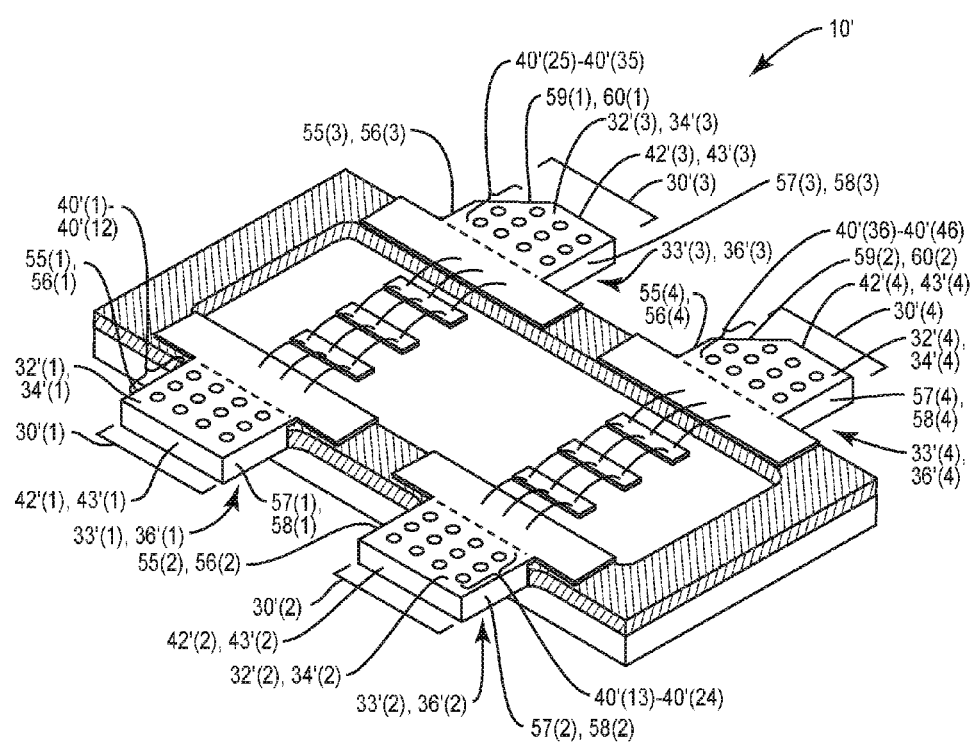
FIG. 5 is a top perspective diagram of another exemplary ring-frame power package with wrap plating.

In addition to the cross-sectional diagram of FIG. 3, FIG. 4 illustrates a cross-sectional diagram of the interconnect tabs 30(2), 30(4) that provides further details of the ring-frame power package 10. Notably, while FIG. 4 illustrates a cross-sectional diagram of the interconnect tabs 30(2), 30(4), the interconnect tabs 30(1), 30(3) are similarly configured. In this manner, as previously described, the ring body 20 portion of the ring structure 18 is disposed over the carrier surface 14 of the thermal carrier 12. The thermal carrier 12 is connected to the ring body 20 by way of a connecting material 50. As non-limiting examples, the connecting material 50 may be a conductive adhesive, a non-conductive adhesive, a solder material, or a combination thereof. Further, the semiconductor devices 44(4)-44(6) are connected to the carrier surface 14 of the thermal carrier 12 by way of a connecting material 52, wherein the connecting material 52 may be a eutectic solder or high thermal adhesive. The type of material selected for the connecting materials 50, 52 may depend on factors such as cost or preferred fabrication methods.

Additionally, in this embodiment, the bottom plated areas 33(2), 33(4) of the corresponding interconnect tab 30(2), 30(4) are disposed so as to form a corresponding gap 54(2), 54(4) between the bottom surface 36(2), 36(4) and the thermal carrier 12. Notably, although not illustrated herein, similar gaps 54(1), 54(3) are formed in relation to the interconnect tabs 30(1), 30(3). The gaps 54(1)-54(4) are formed so as to prevent the wrap plating of each interconnect tab 30(1)-30(4) from electrically coupling to the thermal carrier 12. In this manner, the bottom plated area 33(1)-33(4) may be extended along the corresponding bottom surface 36(1)-36(4) so as to increase the conductivity of the interconnect tab 30(1)-30(4) without creating an electrical short between the interconnect tabs 30(1)-30(4) and the thermal carrier 12. Such a configuration helps the interconnect tabs 30(1)-30(4) to maximize the surface area of the bottom plated areas 33(1)-33(4) so as to achieve a performance similar to interconnect tabs made of a solid first conductive material configured to support high power and high frequency signals.

In addition to the ring-frame power package 10 described in FIGS. 1A-4, FIG. 5 illustrates a top perspective diagram of another exemplary ring-frame power package 10'. The ring-frame power package 10' includes certain common components with the ring-frame power package 10 in FIGS. 1A-4. Such common components that have an associated number "X" in FIGS. 1A-4 are denoted by a number "X" in FIG. 5, and thus will not be re-described herein.

The interconnect tabs 30'(1)-30'(4) included in the ring-frame power package 10' employ the corresponding top and bottom plated areas 32'(1)-32'(4), 33'(1)-33'(4). In this embodiment, the first side plated area 43'(1)-43'(4) of each interconnect tab 30'(1)-30'(4) covers at least a portion of the corresponding first side surface 42'(1)-42'(4) with the first conductive material so as to electrically couple the top and bottom plated areas 32'(1)-32'(4), 33'(1)-33'(4). Additionally, to increase the conductivity of each interconnect tab 30'(1)-30'(4), the wrap plating is adapted to cover additional corresponding sides. In this manner, each second side plated area 55(1)-55(4) covers at least a portion of a second side surface 56(1)-56(4). Each third side plated area 57(1)-57(4) covers at least a portion of a third side surface 58(1)-58(4) of the corresponding interconnect tab 30'(1)-30'(4). Further, fourth side plated areas 59(1), 59(2) cover at least a portion of a fourth side surface 60(1), 60(2) of the corresponding interconnect tab 30'(3), 30'(4).

Electrically coupling the top and bottom plated areas 32'(1)-32'(4), 33'(1)-33'(4) by way of wrap plating along the first side surfaces 42'(1)-42'(4), the second side surfaces 56(1)-56(4), the third side surfaces 58(1)-58(4), and the fourth side surfaces 60(1), 60(2), allows each interconnect tab 30'(1)-30'(4) to function as a continuous unbroken conductor. Further, in this embodiment, each top plated area 32'(1)-32'(4) is also electrically coupled to the corresponding bottom plated area 33'(1)-33'(4) by way of the vias 40'(1)-40'(46), which allows each interconnect tab 30'(1)-30'(4) to have even greater conductivity. Thus, the interconnect tabs 30'(1)-30'(4) may achieve a performance similar to interconnect tabs made of a solid first conductive material configured to support high power and high frequency signals.

Notably, embodiments of the ring-frame power packages 10, 10' described herein employ an in-pocket design. However, alternative embodiments of the ring-frame power packages 10, 10' may employ other designs, such as, but not limited to, a surface mount design, while achieving similar conductivity.

Figure 6A:
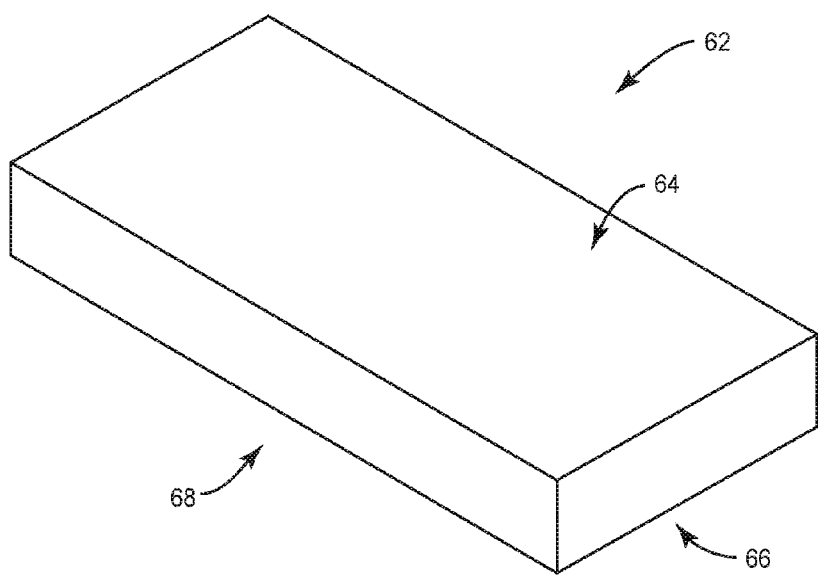
FIG. 6A is a top perspective diagram of an exemplary power package lid.
Figure 6B:
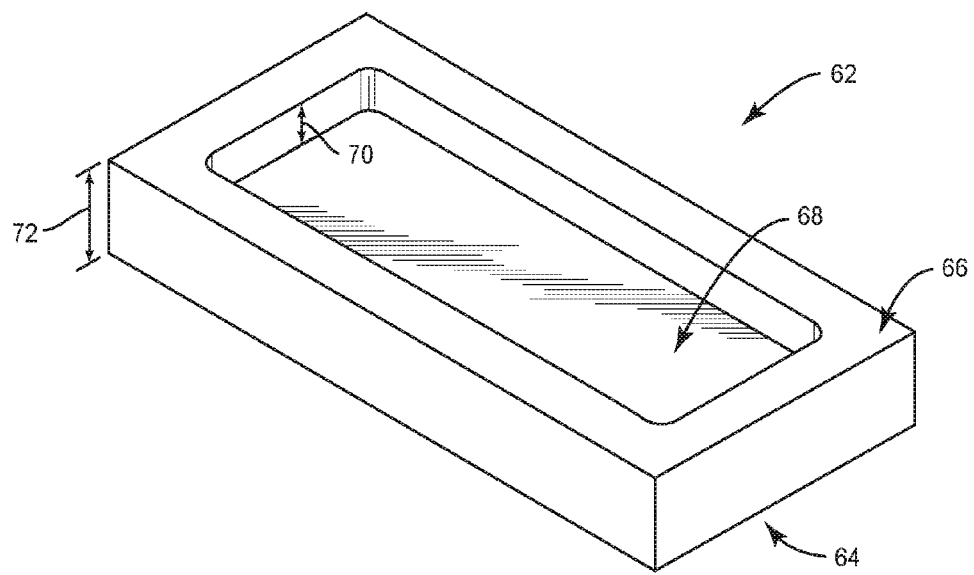
FIG. 6B is a bottom perspective diagram of the power package lid in FIG. 6A.

In addition to the embodiments described above, ring-frame power packages such as the ring-frame power packages 10, 10' can further employ a lid to encase and protect the semiconductor devices 44(1)-44(6) on the carrier surface 14. FIGS. 6A and 6B illustrate an exemplary power package lid 62 that can be employed by such ring-frame packages. FIGS. 6A and 6B provide top and bottom perspectives, respectively, of the power package lid 62. The power package lid 62 includes a top surface 64 and a bottom surface 66. The power package lid 62 also includes a cavity 68 in communication with the interior opening 22 (not shown) of the ring body 20. In this manner, the cavity 68 is formed relative to the bottom surface 66. The cavity 68 has a depth 70 that is less than a thickness 72 of the power package lid 62. In other words, the cavity 68 does not extend completely through the power package lid 62. As a non-limiting example, the thickness 72 of the power package lid 62 can be approximately between 1.2 mm and 2.4 mm, while the depth 70 of the cavity 68 can be approximately between 15% and 90% of the thickness 72 of the power package lid 62. Additionally, the power package lid 62 is formed as a solid structure, and can be formed from an organic material. As non-limiting examples, the organic material of the power package lid 62 may be Isola 370HR or Isola 300MD. In alternative embodiments, the power package lid 62 can be formed from a polyimide material, such as, but not limited to, Isola P95. Organic materials and polyimide materials are less expensive than the ceramics and plastics used to produce conventional lids. Thus, the power package lid 62 can be employed to encase high power, high frequency semiconductor devices at a reduced cost.

Figure 7A:
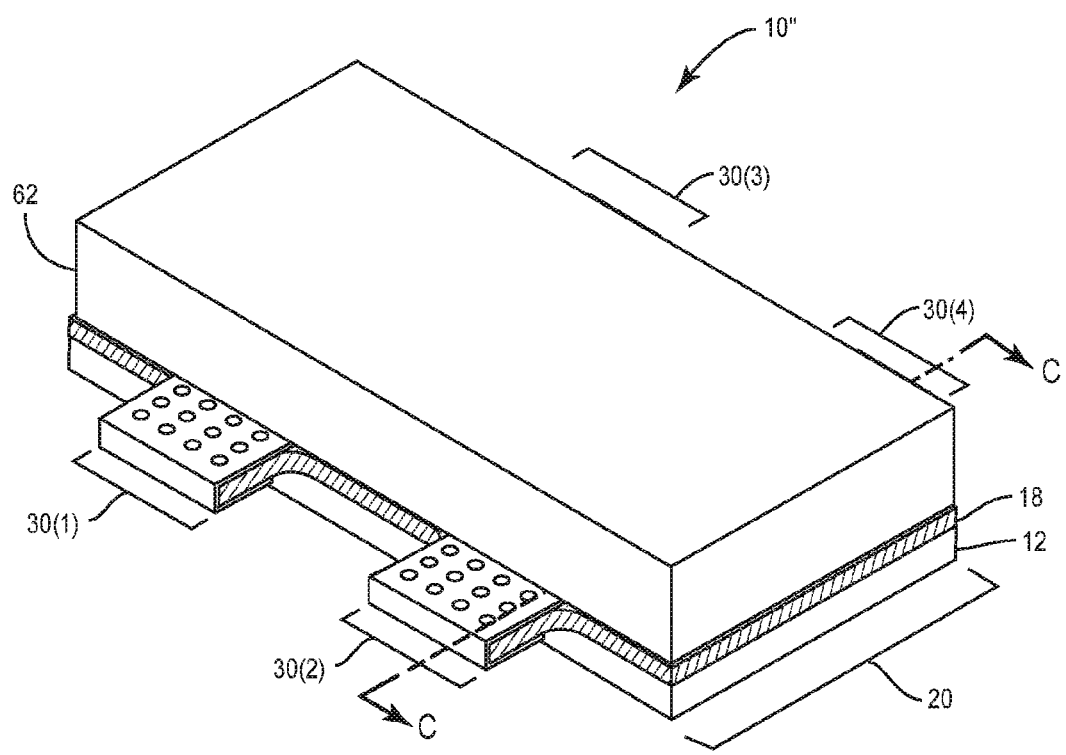
FIG. 7A is a top perspective diagram of an exemplary ring-frame power package employing the power package lid in FIG. 6A.
Figure 7B:
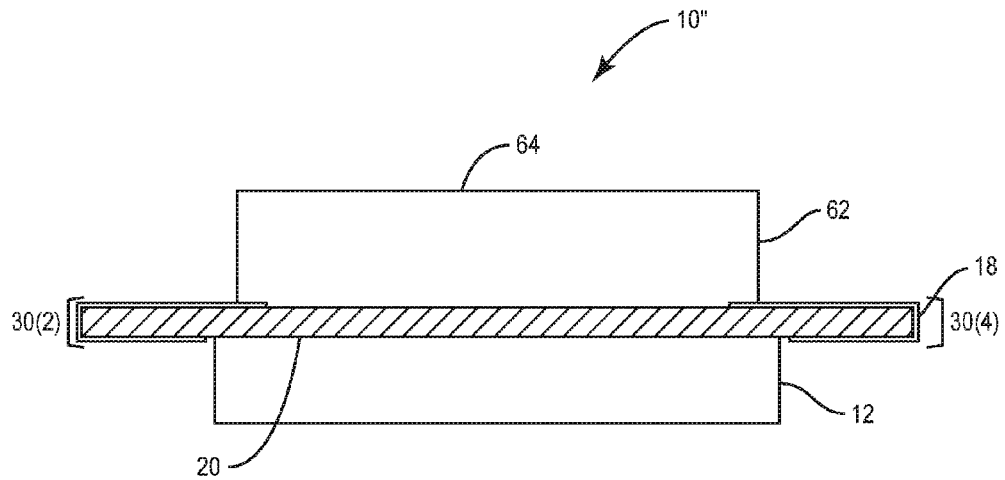
FIG. 7B is a side perspective diagram of the ring-frame power package in 7A.
Figure 7C:
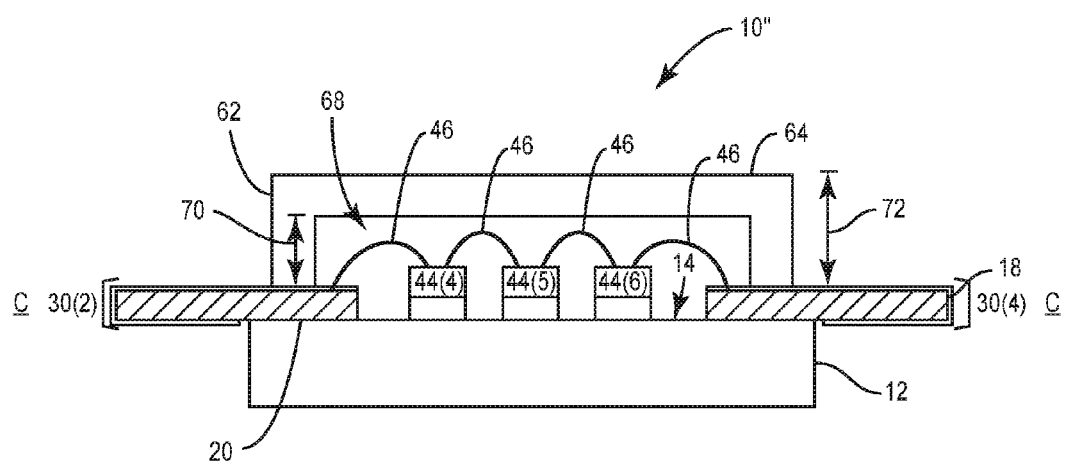
FIG. 7C is a cross-sectional diagram of the ring-frame power package in FIG. 7A.

FIGS. 7A-7C illustrate a ring-frame power package 10" employing the power package lid 62. FIGS. 7A and 7B provide a top perspective and a side perspective diagram of the ring-frame power package 10", respectively, while FIG. 7C provides a cross-sectional diagram of the ring-frame power package 10". As shown in FIGS. 7A-7C, the power package lid 62 resides on the ring body 20 of the ring structure 18 in ring-frame power package 10". In this manner, with reference to FIG. 7C, the cavity 68 encases the semiconductor devices 44(1)-44(6) and the bonding wires 46. The power package lid 62 is attached or adhered to the ring body 20 using a non-conductive epoxy, such as, but not limited to, Ablebond 84-3. Using a non-conductive epoxy allows the power package lid 62 to provide protection to the semiconductor devices 44(1)-44(6) and the bonding wires 46 without creating an electrical short.

Figure 8:
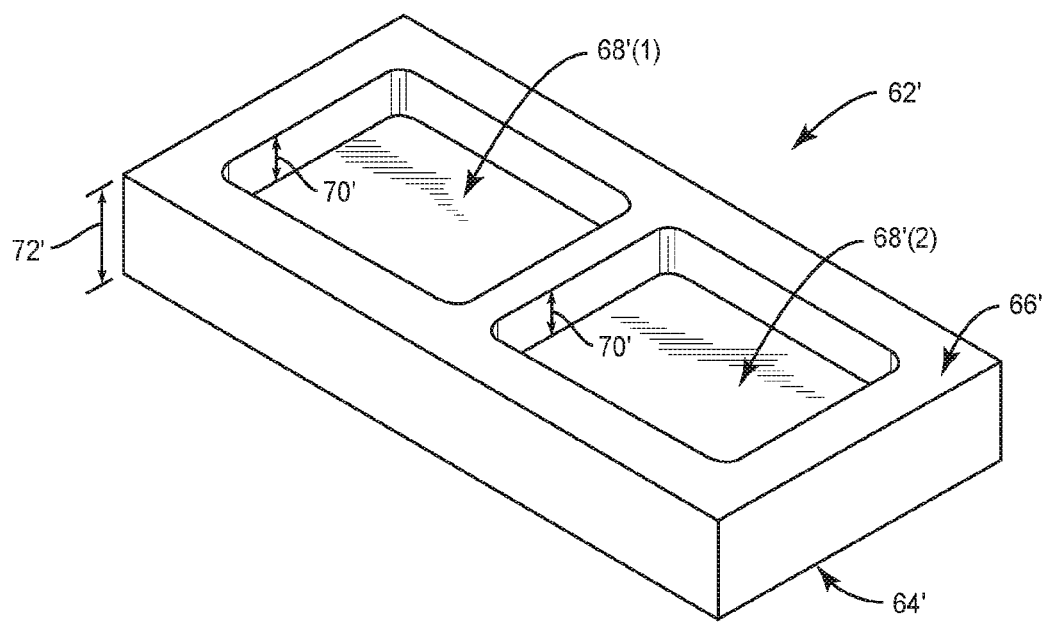
FIG. 8 is a bottom perspective diagram of an exemplary power package lid with multiple cavities.

Additionally, while the power package lid 62 in FIGS. 6A-6B and 7A-7C includes the cavity 68, other embodiments may include multiple cavities. In this manner, FIG. 8 illustrates a power package lid 62' that includes a plurality of cavities 68'(1), 68'(2). Similar to the cavity 68 illustrated in FIG. 6B, the cavities 68'(1), 68'(2) have a depth 70' that is less than a thickness 72' of the power package lid 62'. Although the cavities 68'(1), 68'(2) have the same depth 70', other embodiments may employ the cavities 68'(1), 68'(2) with differing depths. Further, the depth 70' and shape of each cavity 68'(1), 68'(2) may be dependent on the radius and size of the routing tool used to form the cavities 68'(1), 68'(2).

The power package lids 62 and 62' are hermetically sealed to the ring body 20. Thus, the embodiments described herein employing the power package lids 62 and 62' may be configured to be gross leak compliant and meet all moisture sensitivity level (MSL) specification requirements for an assembled product.

Those skilled in the art will recognize improvements and modifications to the embodiments of the present disclosure. All such improvements and modifications are considered to be within the scope of the concepts disclosed herein and the claims that follow.

What is claimed is:

1. A ring-frame power package comprising:
a thermal carrier having a carrier surface;
a ring structure residing on the carrier surface of the thermal carrier, and comprising a ring body and a plurality of interconnect tabs that extend outward from an outer periphery of the ring body, wherein a portion of the carrier surface of the thermal carrier is exposed through an interior opening of the ring body and each interconnect tab of the plurality of interconnect tabs comprises:
a top plated area that covers at least a portion of a top surface of a corresponding interconnect tab and a corresponding contact portion of the ring body; and
a bottom plated area that covers at least a portion of a bottom surface of the corresponding interconnect tab such that the corresponding interconnect tab and the thermal carrier are electrically isolated, wherein the top plated area and the bottom plated area are electrically coupled;
one or more semiconductor devices connected to the portion of the carrier surface of the thermal carrier; and a power package lid residing on the ring body and having at least one cavity conjoined with the interior opening of the ring body, wherein:

the one or more semiconductor devices are exposed to the at least one cavity; and the at least one cavity has a depth less than a thickness of the power package lid.

2. The ring-frame power package of claim 1 wherein the power package lid is formed as a solid structure.

3. The ring-frame power package of claim 2 wherein the power package lid is formed from an organic material.

4. The ring-frame power package of claim 3 wherein the organic material is selected from the group consisting of Isola 370HR and Isola 300MD.

5. The ring-frame power package of claim 2 wherein the power package lid is formed from a polyimide material.

6. The ring-frame power package of claim 5 wherein the polyimide material comprises Isola P95.

7. The ring-frame power package of claim 1 wherein the thickness of the power package lid is approximately between 1.2 mm and 2.4 mm.

8. The ring-frame power package of claim 7 wherein the depth of the at least one cavity is approximately between 15% and 90% of the thickness of the power package lid.

9. The ring-frame power package of claim 1 wherein the at least one cavity comprises:

a plurality of separate cavities conjoined with the interior opening of the ring body.

10. The ring-frame power package of claim 9 wherein each separate cavity of the plurality of separate cavities has a depth less than the thickness of the power package lid.

11. The ring-frame power package of claim 10 wherein the power package lid has a thickness approximately between 1.2 mm and 2.4 mm.

12. The ring-frame power package of claim 11 wherein each separate cavity of the plurality of separate cavities has a depth approximately between 15% and 90% of the thickness of the power package lid.

13. The ring-frame power package of claim 1 wherein the power package lid is attached to the ring body via a non-conductive epoxy.

14. The ring-frame power package of claim 13 wherein the non-conductive epoxy comprises Ablebond 84-3.

15. The ring-frame power package of claim 1 wherein the at least one cavity comprises a first cavity and a second cavity, both of which are conjoined with the interior opening of the ring body.

16. The ring-frame power package of claim 15 wherein the first cavity and the second cavity have a same depth.

17. The ring-frame power package of claim 15 wherein the first cavity and the second cavity have different depths.

* * * * *